(12) United States Patent
Taylor

(10) Patent No.: US 9,143,312 B2
(45) Date of Patent: Sep. 22, 2015

(54) USING A SINGLE PHASE ERROR ALGORITHM FOR COARSE AND FINE SIGNAL TIMING SYNCHRONISATION

(71) Applicant: Imagination Technologies Limited, Kings Langley (GB)

(72) Inventor: Neil Taylor, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/576,320

(22) Filed: Dec. 19, 2014

(65) Prior Publication Data

US 2015/0180645 A1    Jun. 25, 2015

(30) Foreign Application Priority Data

Dec. 19, 2013 (GB) .................................. 1322503.2
Dec. 5, 2014 (GB) .................................. 1421666.7

(51) Int. Cl.
*H04B 3/48* (2015.01)
*H04Q 1/20* (2006.01)
*H04L 7/00* (2006.01)
*H04L 7/033* (2006.01)

(52) U.S. Cl.
CPC ............ *H04L 7/0087* (2013.01); *H04L 7/0331* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,094,732 | B2 * | 1/2012 | Jahan et al. | 375/260 |
| 2006/0262868 | A1 * | 11/2006 | Leshem | 375/260 |
| 2007/0173303 | A1 * | 7/2007 | Viorel et al. | 455/575.7 |

* cited by examiner

*Primary Examiner* — Erin File
(74) *Attorney, Agent, or Firm* — Vorys, Sater, Seymour and Pease LLP; Vincent M DeLuca

(57) ABSTRACT

Rather than using separate sample rate offset and phase offset estimation algorithms for coarse timing synchronization and fine timing synchronization of a receiver timing, respectively, one phase error algorithm can be used for both the coarse and fine timing synchronization. In order to perform coarse timing synchronization the phase error indications sampled over a sampling period are used to form an error vector, and a Fourier transform can then be applied to the error vector. An analysis of the Fourier transform of the error vector can be used to determine a frequency component identifying an offset between the receiver frequency and the signal frequency. The frequency of the receiver timing can then be adjusted in accordance with the identified offset, thereby performing the coarse timing synchronization. Once the coarse timing synchronization has been applied, the same phase error algorithm may be used, without the Fourier transform, to implement the fine timing synchronization.

21 Claims, 8 Drawing Sheets

USING A SINGLE PHASE ERROR ALGORITHM FOR COARSE AND FINE SIGNAL TIMING SYNCHRONISATION

CROSS-REFERENCE TO RELATED APPLICATIONS

This application claims priority under 35 U.S.C. §119(a) from United Kingdom Patent Application No. 1322503.2 filed 19 Dec. 2013, and United Kingdom Patent Application No. 1421666.7 filed 5 Dec. 2014, which applications are hereby incorporated herein by reference in their entireties.

BACKGROUND

Data signals which have been transmitted from a transmitter can be received at a receiver. The data signal is transmitted at a carrier frequency and may contain digital data in the form of data symbols. The data signals may be wireless signals such as radio signals transmitted through a wireless channel, or wired signals transmitted on a wired channel, such as using a coaxial cable.

A receiver operates at a baseband frequency. In order to correctly receive a digital data signal, the data signal is downmixed from the carrier frequency to the baseband frequency. In order to do this, the receiver determines the carrier timing (i.e. the carrier frequency and phase) of the waveform of the received data signal. As well as determining the carrier frequency and phase, the timing of the data symbols is determined so that the receiver can sample the data symbols at the correct frequency and phase (i.e. at the correct timing) in order to faithfully reproduce the transmitted data symbols.

The receiver uses a receiver carrier timing which it can adjust to match (or "lock onto") the carrier timing of the data signal. Similarly, the receiver uses a receiver symbol timing which it can adjust to match (or "lock onto") the symbol timing of the data signal. In order to adjust the receiver timing (where the "receiver timing" is e.g. the receiver carrier timing and/or the receiver symbol timing), the receiver determines an indication of a phase error between the receiver timing and the signal timing (where the "signal timing" is e.g. the data signal carrier timing and/or the data signal symbol timing), and then adjusts the receiver timing based on the determined phase error indication to thereby reduce the error. This can be performed iteratively to bring the receiver timing closely in synchronisation with the signal timing. There are phase error algorithms which determine phase error indications (or "error metrics") for carrier and symbol phase offsets by sampling the data signal in accordance with the receiver timing and measuring a phase error for individual samples. However, when such phase error algorithms (which measure errors for individual samples) are used in the presence of noise or channel distortion, the phase error indications that are determined may be unreliable due to the noise and/or channel distortion. To address this issue, the phase error indications can be averaged over an averaging period including many samples in order to achieve a more stable and accurate phase error indication. The average phase error indications can then be passed to Phase-Locked Loops (PLLs) controlling the receiver's local oscillators and sample timing hardware to match the receiver carrier and symbol timing to the signal carrier and symbol timing of the incoming data signal.

For the case of symbol timing, any error (referred to herein as "sample rate offset") between the rate (i.e. frequency) at which the receiver samples the received signal and the rate at which the data symbols occur in the data signal will cause the sample points to slip (or "drift") relative to ideal sample points. As the timing of the receiver sampling varies relative to the ideal sample timing (according to the signal symbol timing), the phase error will vary over the averaging period. Averaging the varying phase error indications over the averaging period will reduce the accuracy of the phase error measurement if the phase error has varied significantly over the averaging period. There is a limit to how much the phase error measurements can vary over the averaging period before the phase error measurements stop being useful for matching the receiver timing to the signal timing. If the offset in the sample timing used by the receiver relative to the signal symbol timing varies by more than a fraction of a symbol period over the averaging period, then the average phase error indication determined by the phase error algorithm may cease to be a reliable measure with which to correctly adjust the receiver symbol timing, and signal acquisition may fail at the receiver. A similar limit applies for adjusting the receiver carrier timing to match the signal carrier timing, where the phase error indications determined by a phase error algorithm may become meaningless if the phase error changes significantly over an averaging period.

Therefore, the phase error algorithms described above are used for performing fine timing synchronisation once a low symbol and/or carrier rate offset has been achieved. In order to achieve a low symbol and carrier rate offset, other methods are initially used to perform coarse timing synchronisation to achieve sufficiently low symbol and carrier rate offsets such that the phase error algorithms described above can be applied for the fine timing synchronisation. Therefore the receiver implements two phase error algorithms (one to perform coarse timing synchronisation and one to perform fine timing synchronisation) and implements a procedure to handover between the two algorithms.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In examples described herein, rather than using different phase error algorithms for coarse timing synchronisation and fine timing synchronisation, one phase error algorithm can be used for both coarse and fine timing synchronisation. This simplifies the process and reduces the amount of hardware used to implement the methods described herein compared to using different algorithms for the coarse and fine timing synchronisation stages, as in the examples described above in the background section. In order to perform coarse timing synchronisation, rather than averaging the phase error indications over an averaging period, the phase error indications over a sampling period can be used to form an error vector and a Fourier transform can be applied to the error vector. An analysis of the Fourier transform of the error vector can be used to determine a frequency component identifying an offset between the receiver frequency and the signal frequency. The receiver timing (e.g. the frequency of the receiver timing) can then be adjusted in accordance with the identified offset, thereby performing the coarse timing synchronisation. Once the coarse timing synchronisation has been applied, the same phase error algorithm may be used, without the Fourier transform, to implement the fine timing synchronisation. The receiver timing and signal timing may be a receiver symbol timing and signal symbol timing respectively. Alternatively, the receiver timing and signal timing may be a receiver carrier timing and signal carrier timing respectively.

In particular, there is provided a method of adjusting a receiver timing to more closely match a signal timing of a data signal, the method comprising: receiving the data signal in accordance with the receiver timing; determining a first set of phase error indications indicating phase errors between the receiver timing and the signal timing according to a particular phase error algorithm, wherein the first set of phase error indications forms an error vector; applying a Fourier transform to the error vector; analysing the Fourier transform of the error vector to determine a frequency component of the error vector which identifies a frequency difference between the receiver timing and the signal timing; adjusting the receiver timing based on the identified frequency difference; determining an average of a second set of phase error indications indicating phase errors between the adjusted receiver timing and the signal timing according to said particular phase error algorithm; and adjusting the receiver timing based on the determined average of the second set of phase error indications.

In some examples, the step of adjusting the receiver timing based on the identified frequency difference comprises adjusting the frequency of the receiver timing based on the identified frequency difference; and the step of adjusting the receiver timing based on the determined average of the second set of phase error indications comprises adjusting the phase of the receiver timing based on the determined average of the second set of phase error indications. Furthermore, the first set of phase error indications may be determined over a first sampling period, and the average of the second set of phase error indications may be determined over a second sampling period (e.g. where the first sampling period may be longer than the second sampling period). The signal timing may be a symbol timing of data symbols in the data signal, and the receiver timing may be the timing with which the data signal is sampled to determine the data symbols in said step of receiving the data signal, in which case the particular phase error algorithm may be the Gardner algorithm. The signal timing may be a carrier timing of the data signal, and the receiver timing may be an estimate of the carrier timing which is used in said step of receiving the data signal.

There is provided a receiver configured to adjust a receiver timing to more closely match a signal timing of a data signal, the receiver comprising: a receive module configured to receive the data signal in accordance with the receiver timing; an error module configured to determine a first set of phase error indications indicating phase errors between the receiver timing and the signal timing according to a particular phase error algorithm, wherein the first set of phase error indications forms an error vector; and a Fourier transform module configured to apply a Fourier transform to the error vector, the Fourier transform module being further configured to analyse the Fourier transform of the error vector to determine a frequency component of the error vector which identifies a frequency difference between the receiver timing and the signal timing; wherein the receive module is configured to adjust the receiver timing based on the identified frequency difference; wherein the error module is configured to determine an average of a second set of phase error indications indicating phase errors between the adjusted receiver timing and the signal timing according to said particular phase error algorithm; and wherein the receive module is configured to adjust the receiver timing based on the determined average of the second set of phase error indications.

There may be provided computer readable code adapted to perform the steps of any of the methods described herein when the code is run on a computer. The computer readable code may be encoded on a computer readable storage medium.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
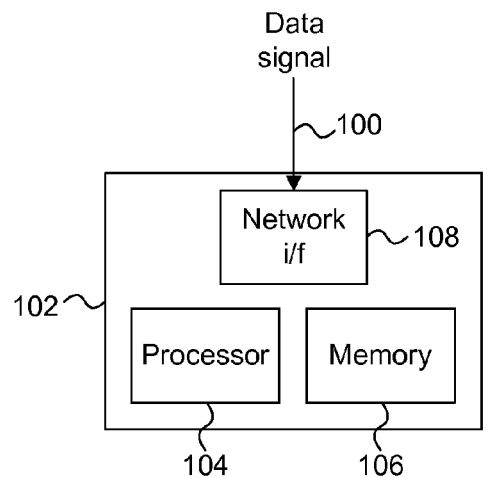
FIG. 1 shows a simple diagram of a receiver.

Common reference numerals are used throughout the figures, where appropriate, to indicate similar features.

DETAILED DESCRIPTION

Embodiments will now be described by way of example only.

FIG. 1 shows a data signal 100 which has been transmitted from a transmitter. The data signal 100 is a digital signal comprising data symbols. The data signal could be a wireless signal (e.g. a radio signal) transmitted on a wireless channel (e.g. through the air) or could be a wired signal transmitted on a cable (e.g. a coaxial cable). A receiver 102 is arranged to receive the data signal 100 and determine the data symbols that are present in the data signal 100. The receiver 102 comprises a processor 104, a memory 106 and a network interface 108. The network interface may for example include an antenna in the case in which the data signals are wireless signals. The network interface 108 is arranged to receive the data signal 100 at the receiver 102. The processor 104 may be any suitable form of processor, e.g. a central processing unit (CPU) or a digital signal processor (DSP), configured to execute instructions for processing the received data signal. The memory 106 is configured to store data (e.g. the received data symbols from the data signal 100) and/or computer program products which can be executed on the processor 104. The receiver 102 will most likely include other components which, for clarity, are not shown in FIG. 1, such as user interface components.

Figure 2:
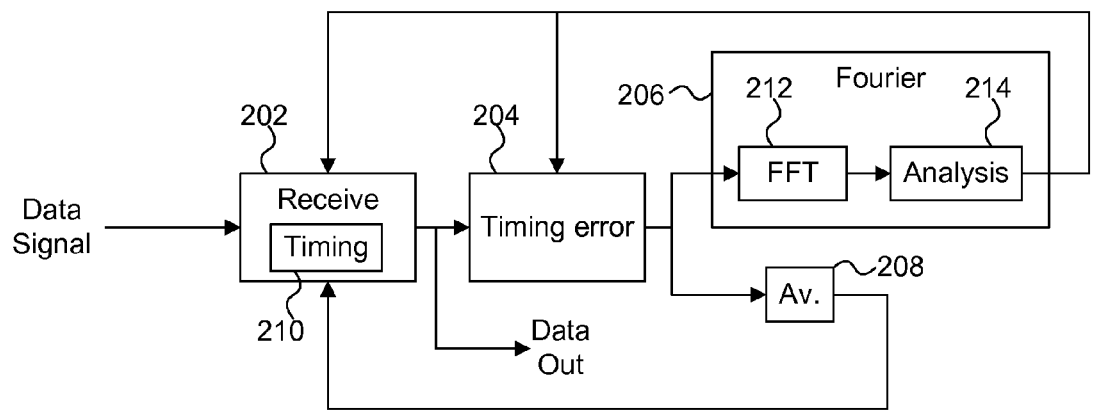
FIG. 2 shows a functional block diagram of modules implemented by a processor of a receiver.

FIG. 2 shows a functional block diagram of modules implemented by the processor 104. The processor 104 implements a receive module 202, an error module 204, a Fourier transform module 206 and an averaging module 208. The receive module 202 comprises a timing module 210, which itself comprises a Phase Locked Loop (PLL). The Fourier transform module 206 comprises a Fast Fourier Transform (FFT) unit 212 and an analysis unit 214. The receive module 202 is arranged to receive the data signal at a first input, e.g. from the network interface 108. An output of the receive module 202 is coupled to a first input of the error module 204. The output of the receive module 202 is also arranged to provide data symbols as an output. An output of the error module 204 is coupled to an input of the FFT unit 212 of the Fourier transform module 206 and to an input of the averaging module 208. An output of the FFT unit 212 is coupled to an input of the analysis unit 214. An output of the analysis unit 214 is coupled to a second input of the receive module 202 and to a second input of the error module 204. An output of the averaging module 208 is coupled to a third input of the receive module 202. In general, the modules of the processor 104 shown in FIG. 2 may be implemented in software, hardware or any combination thereof. Furthermore, the arrangement of the modules shown in FIG. 2 is given by way of example only.

Figure 3:
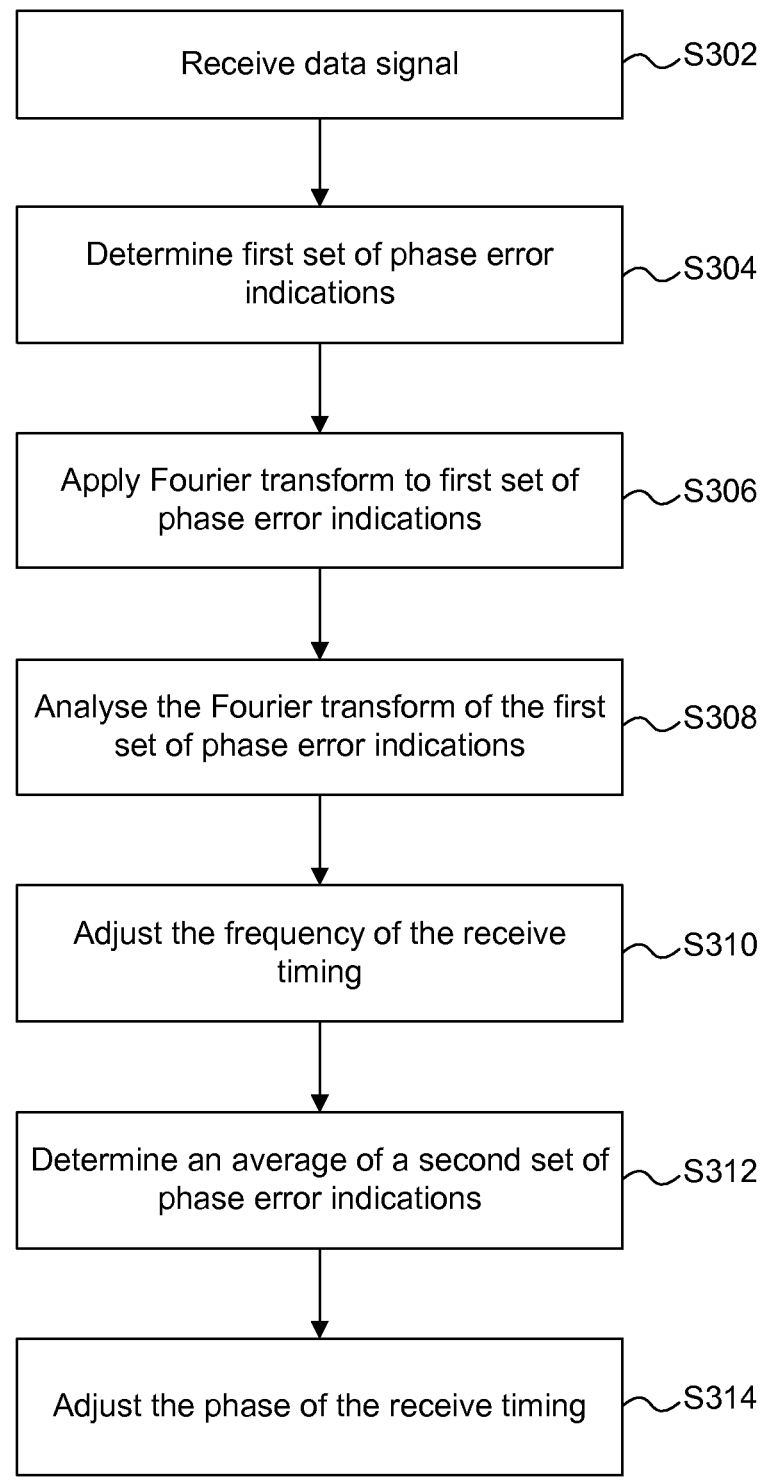
FIG. 3 shows a flow chart for a method of adjusting a receiver timing to more closely match a signal timing of a data signal.

The operation of the receiver 102 is described in relation to FIG. 3 which shows a flow chart for a method of adjusting a receiver timing to more closely match a signal timing of the data signal 100.

In step S302 the receiver 102 receives the data signal 100. The data signal 100 is received at the network interface 108 and passed to the receive module 202. The receive module 202 operates in accordance with a receiver timing to determine data symbols from the data signal. In accordance with the description above, in order to correctly receive a digital data signal, the receive module 202 downmixes the data signal from the carrier frequency to the baseband frequency of the receiver 102. The timing module 210 contains a PLL which is used to control the receiver carrier frequency and phase to match it to the carrier frequency and phase of the data signal. The timing module 210 also uses a PLL to control the receiver symbol timing so that the data signal is sampled at appropriate times in accordance with the signal symbol timing.

Similar methods can be used to adjust the receiver carrier timing and the receiver symbol timing (which can both be referred to generally as "receiver timing") to more closely match the respective signal carrier frequency and phase timing and the signal symbol timing (which can both be referred to generally as "signal timing"), in accordance with the examples described herein. The examples may be more clearly explained in relation to adjusting the receiver symbol timing than in relation to adjusting the receiver carrier timing. Therefore, we will first describe below how the receiver symbol timing is adjusted. Corresponding principles can be applied to adjusting the receiver carrier timing. The ordering of whether to adjust the symbol timing before the carrier timing or to adjust the carrier timing before the symbol timing is implementation dependent. As an example, the symbol timing may be synchronized first using the Gardner algorithm which is insensitive to carrier timing offset. Then the carrier synchronization may be simplified because the symbol timing is already synchronized.

In step S302, the receive module 202 samples the data signal at times in accordance with a receiver symbol timing to thereby determine the data symbols in the data signal. The sampled data symbols are provided to the error module 204. In step S304 the error module 204 determines a first set of phase error indications for respective samples over a first sampling period according to a particular phase error algorithm. Each of the phase error indications is a measure of the phase error between the receiver symbol timing and the signal symbol timing for a particular sample. The phase error indications may be referred to as phase error metrics. The first sampling period may, for example, be 256 or 512 samples.

The phase error algorithm used by the error module 204 may, for example, be any algorithm which has a periodic (e.g. sinusoidal) response when there is a difference between the frequency of the receiver symbol timing and the frequency of the signal symbol timing. Examples of suitable phase error algorithms are the Mueller and Muller algorithm and the Gardner algorithm. The examples which are described in detail below are described in relation to the Gardner algorithm, but other algorithms could be used.

Figure 4:
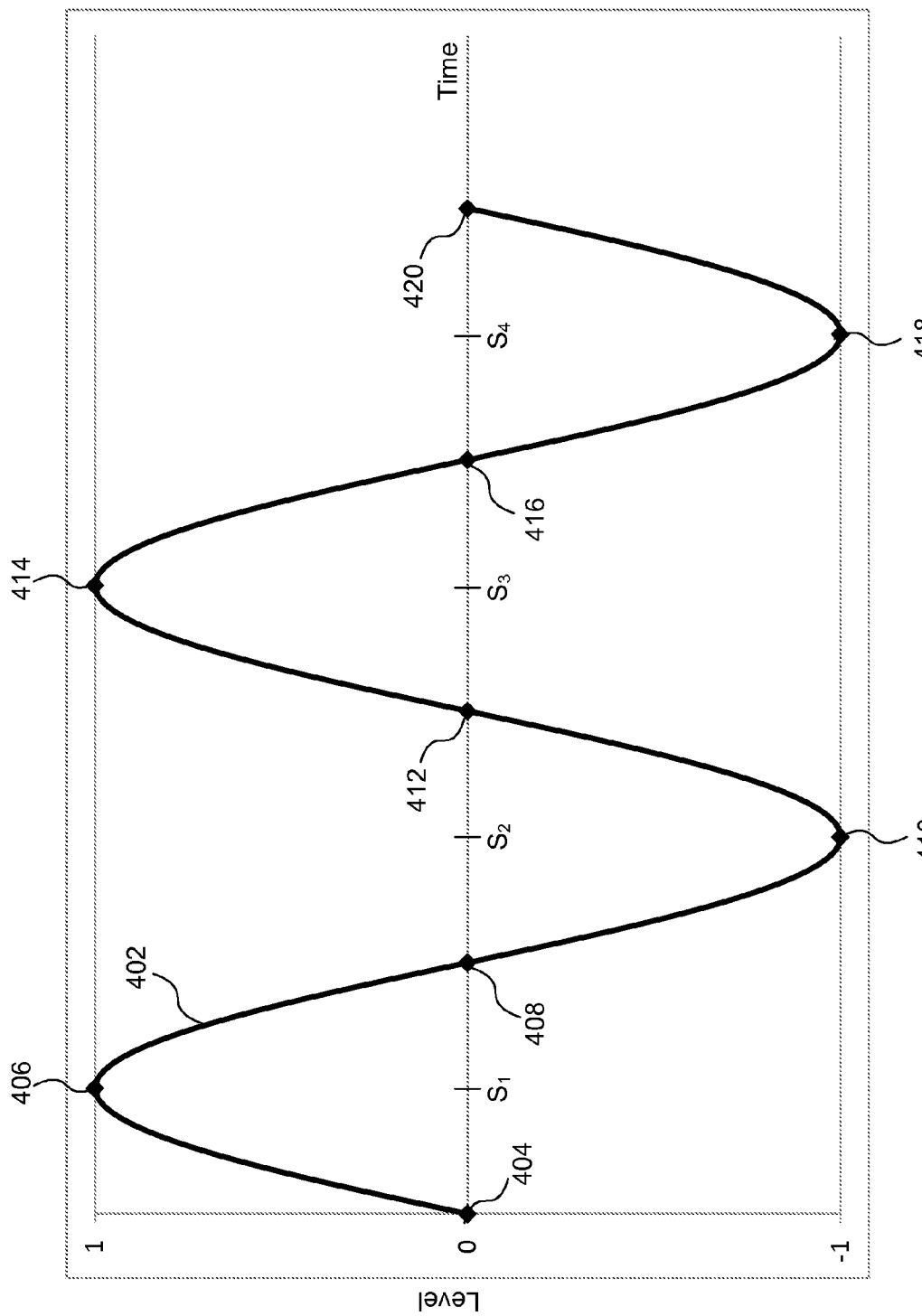
FIG. 4 is a graph showing ideal sampling points on a data signal.

FIG. 4 is a graph showing the ideal sampling points on a data signal. The line 402 shown in FIG. 4 shows how the level of the data symbols in the data signal varies as a function of time. The ideal sampling times for sampling the data symbols in the data signal are at the peaks and troughs of the data signal, i.e. at times $S_1$, $S_2$, $S_3$ and $S_4$ as shown in FIG. 4. According to the Gardner algorithm, two samples are taken for each of a plurality of symbols. Ideally, when using the Gardner algorithm, the receiver module 202 would sample the data signal 100 at times indicated by the points shown in FIG. 4 and denoted 404, 406, 408, 410, 412, 414, 416, 418 and 420.

Figure 5:
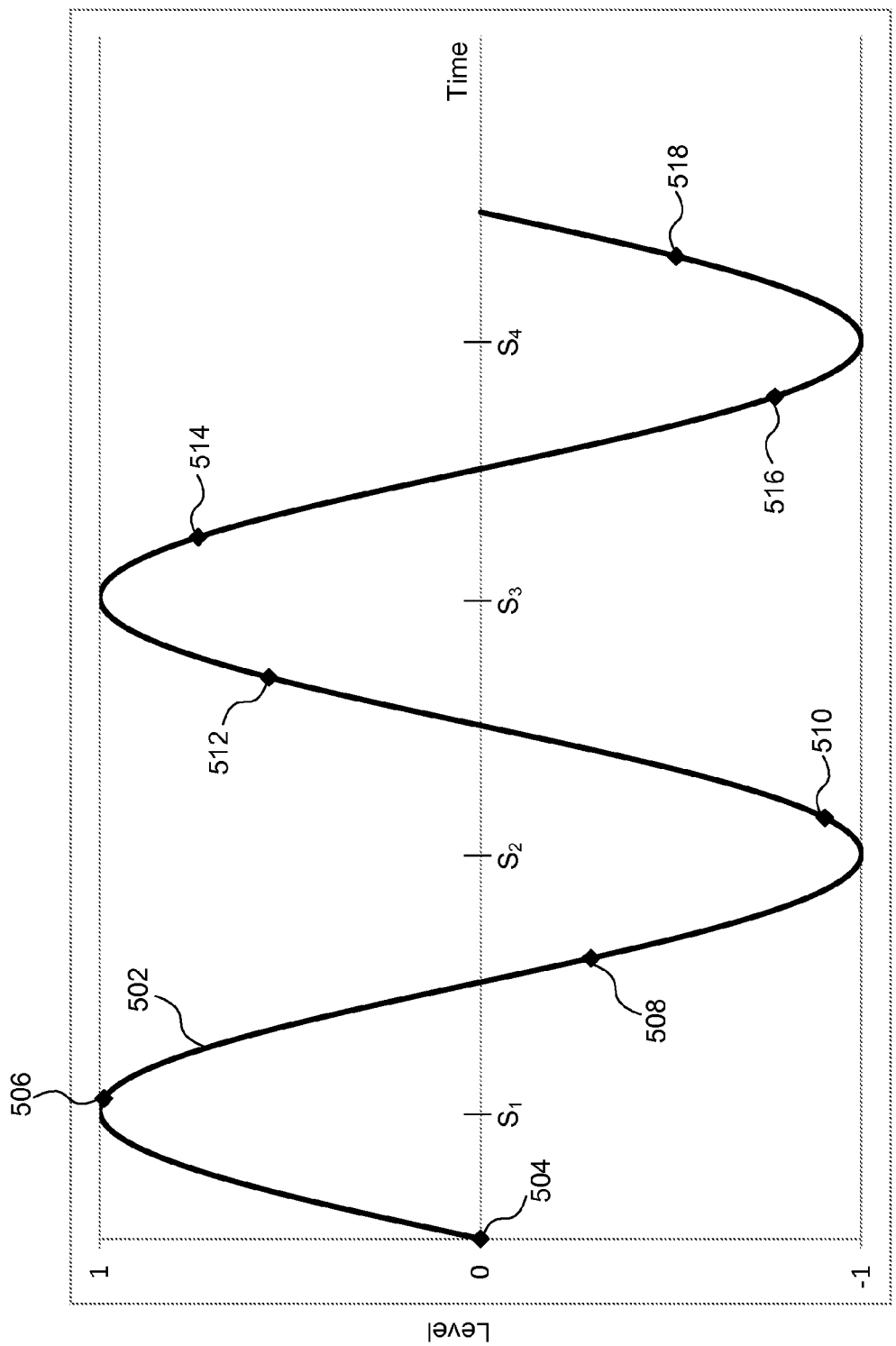
FIG. 5 is a graph showing non-ideal sampling points on a data signal.

If there is an error between the receiver symbol timing and the signal symbol timing then the receive module 202 will not sample the data signal at all of the ideal sample points (404 to 420) shown in FIG. 4 (such a scenario is shown in FIG. 5, described in more detail below). The error module 204 determines a phase error indication for each of the symbols (noting that in this example there are two samples for each symbol) which indicates the error in the timing at which that symbol was sampled.

For example, the input signal may be sampled at time n to determine a sample value $y_n$, and may be sampled at time (n+1) to determine a sample value $y_{n+1}$, and so on, where times n and (n+1) are separated by one symbol period as judged by the receiver symbol timing. In a simple example in which the Gardner algorithm is implemented assuming real-only data $y_{n,re}$ (or using only one complex component of complex input data) a phase error indication $e_{n,re}$ may be determined according to the equation:

$$e_{n,re} = (y_{n,re} - y_{(n-1),re})y_{(n-\frac{1}{2}),re} \qquad (1)$$

For the ideal sample timing shown in FIG. 4, the phase error indications for each symbol will be zero. For example, at point 410, the phase error indication may be determined to be: $e_{re}(410)=(y_{re}(410)-y_{re}(406))y_{re}(408)=(-1-1)0=0$, where $e_{re}(410)$ is the phase error indication that is determined at the sample point 410, and where $y_{re}(406)$, $y_{re}(408)$ and $y_{re}(410)$ are the levels of the data signal at the respective sample points 406, 408 and 410. Similarly, at point 414, the phase error indication may be determined to be:

$$e_{re}(414)=(y_{re}(414)y_{re}(410))y_{re}(412)=(1+1)0=0.$$

As an enhancement to the simple example in which only the real component of the input data is used, the Gardner algorithm can be used on complex data, using real ($y_{n,re}$) and imaginary ($y_{n,im}$) components of complex sample values $y_n$ as two independent measures of phase error. The two measures should give the same output value, so by adding them together some gains can be provided in the presence of noise, i.e. the signal to noise ratio can be increased. That is, a phase error indication $e_{n,complex}$ may be determined according to the equation:

$$e_{n,complex} = (y_{n,re} - y_{(n-1),re})y_{(n-\frac{1}{2}),re} + (y_{n,im} - y_{(n-1),im})y_{(n-\frac{1}{2}),im} \quad (2)$$

As another enhancement to the Gardner algorithm (which may build upon the Gardner algorithm using real values ($e_{n,re}$) or upon the Gardner algorithm using complex values ($e_{n,complex}$)) a coherent sum of in-phase and antiphase measures of phase error (½ symbol period apart) may be implemented. Given identical phase offsets, the two measures should give the same value, but with opposing sign, so by subtracting one from the other some gains can be provided in the presence of noise, i.e. the signal to noise ratio can be increased. That is, a phase error indication $e_{n,IA}$ may be determined according to the equation:

$$e_{n,IA} = e_n - e_{n+\frac{1}{2}} \quad (3)$$

where $e_n$ may be $e_{n,re}$ and $e_{n+1/2}$ may be $e_{n+1/2,re}$ in accordance with equation 1, or where $e_n$ may be $e_{n,complex}$ and $e_{n+1/2}$ may be $e_{n+1/2,complex}$ in accordance with equation 2.

It may also be useful (particularly for the coarse adjustment stage which makes use of a Fourier transform, as described in more detail below) to use a modified version of the Gardner algorithm which allows a determination of the polarity of a frequency offset, i.e. whether a frequency offset is positive or negative. This can be done by generating a quadrature component from complex values determined using the complex Gardner algorithm, taken at a ¼ symbol period offset relative to the in-phase component. That is, a phase error indication $e_{n,IQ}$ may be determined according to the equation:

$$e_{n,IQ} = e_n + je_{n+\frac{1}{4}} \quad (4)$$

where $e_n$ may be $e_{n,complex}$ and $e_{n+1/2}$ may be $e_{n+1/2,complex}$ in accordance with equation 2.

It is noted that $e_{n,complex}$ and $e_{n,IA}$ may be formed by repeated application of the simple equation 1 for $e_{n,re}$ on different samples or components of the input data signal. Any of $e_{n,re}$, $e_{n,complex}$ and $e_{n,IA}$, can form the basis for the (real-only) input to fine timing and for each of the $e_n$ and $e_{n+1/4}$ components of the $e_{n,IQ}$ used in coarse timing (determined according to equation 4). The choice between whether to use $e_{n,re}$, $e_{n,complex}$ or $e_{n,IA}$, bases is a trade-off between performance and complexity, with $e_{n,re}$, being the least complex to implement but providing the worst performance (e.g. lowest signal to noise) ratio, wherein $e_{n,IA}$ and $e_{n,complex}$ are more complex to implement but providing better performance (e.g. higher signal to noise) ratio.

FIG. 5 is a graph showing non-ideal sampling points on a data signal. The line 502 shown in FIG. 5 shows how the level of the data symbols in the data signal varies as a function of time. FIG. 5 shows the situation in which there is an error in the frequency of the receiver symbol timing, such that the data signal is sampled at a different rate to the ideal sampling timing shown in FIG. 4. The data signal shown in FIG. 5 is the same as that shown in FIG. 4, but the receiver timing is different in FIG. 5 to the ideal receiver timing shown in FIG. 4. In particular, as an example, FIG. 5 shows a 9% frequency error, i.e. a 9% sampling rate offset between the receiver symbol timing and the signal symbol timing. The ideal sampling times for sampling the data symbols in the data signal are at the peaks and troughs of the data signal, i.e. at times $S_1$, $S_2$, $S_3$ and $S_4$ (in the same way as described above in relation to FIG. 4). When using the Gardner algorithm, the receiver module 202 samples the data signal 100 at the times indicated by the points shown in FIG. 5 and denoted 504, 506, 508, 510, 512, 514, 516 and 518. It can be seen that, due to the frequency offset between the receiver timing and the signal timing, the data signal is not sampled at the ideal sampling points (i.e. at the signal peaks and troughs) in the example shown in FIG. 5.

Because the receiver timing is not synchronised with the signal timing in the example shown in FIG. 5, at least some of the phase errors indicated by the phase error indications determined by the error module 204 will be non-zero. For example, the error module 204 may implement the Gardner algorithm which determines the phase error indications, $e_{n,re}$, according to equation (1), so for the sample points shown in FIG. 5, the determined phase error indications will be non-zero. For example, at point 510, the phase error indication may be determined to be:

$e_{re}(510) = (y_{re}(510) - y_{re}(506))y_{re}(508) = (-0.90 - 0.99)(-0.29) = 0.55$, where $y_{re}(506)$, $y_{re}(508)$ and $y_{re}(510)$ are the amplitudes of the data signal at the respective sample points 506, 508 and 510. Similarly, at point 514, the phase error indication may be determined to be:

$e_{re}(514) = (y_{re}(514) - y_{re}(510))y_{re}(512) = (0.74 + 0.90)(0.56) = 0.92$.

Similar phase error indications could be determined using the more complex implementations of the Gardner algorithm according to equations 2 to 4, as described above.

The offset between the frequency of the receiver symbol timing and the frequency of the signal symbol timing causes the phase error indication values to vary periodically. In the example of the Gardner algorithm, the phase error indications will vary sinusoidally over the sampling period. The frequency with which the phase error indications oscillate is dependent on the frequency offset between the receiver symbol timing and the signal symbol timing (referred to herein as the "sample rate offset").

Figure 6:
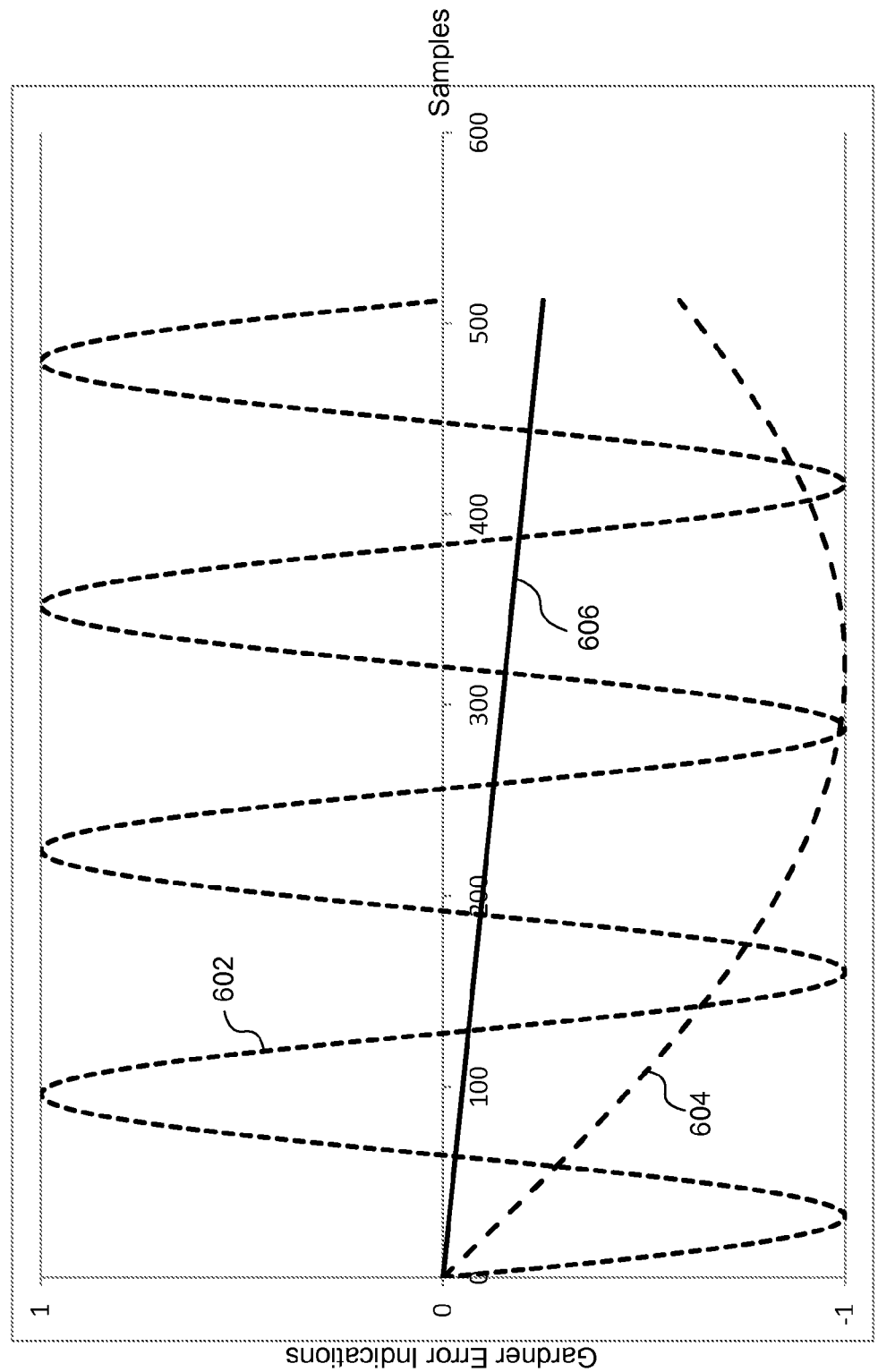
FIG. 6 is a graph showing phase error indications determined according to a phase error algorithm with three different sample rate offsets.

FIG. 6 is a graph showing how the phase error indications determined according to the Gardner algorithm vary with time (symbol) for three different sample rate offsets over a sampling period of 512 samples (which would correspond to 256 symbols if two samples were taken for each symbol, i.e. if the sampling rate ideally matched the symbol rate of the data signal).

The dashed line denoted 602 in FIG. 6 shows the phase error indications output from the error module 204 in the case of a relatively high sample rate offset of, for example, approximately 1%. The line 602 completes multiple periods of oscillation within the sampling window of 512 samples. The dashed line denoted 604 in FIG. 6 shows the phase error indications output from the error module 204 in the case of a mid-level sample rate offset of, for example, approximately 0.1%. The line 604 completes more than a quarter but less than a half of a full period of oscillation within the sampling window of 512 samples. The solid line denoted 606 in FIG. 6 shows the phase error indications output from the error module 204 in the case of a relatively low sample rate offset of, for example, approximately 0.01%. The line 606 completes much less than a quarter of a period of oscillation within the sampling window of 512 samples, and can be approximated by a straight line.

It can be appreciated that the lower the sample rate offset, the less the phase errors (and therefore the corresponding phase error indications) will vary within the sampling window. In accordance with the systems described in the background section above, fine phase error adjustments can be made by determining the average of the phase error indications over a sampling period. This works well when the sample rate offset is low. For example, for line 606 which corresponds to a low sample rate offset of approximately 0.01%, the average of the phase error indications over the 512 samples shown in FIG. 6 can be used to give a good indication of the sample phase offset. Furthermore, there is often a delay between calculating the average of the phase error indications and applying a timing correction based on the calculated average. Since the phase errors are varying slowly the phase error will not change by a large amount during this delay. However, for a high sample rate offset, e.g. for line 602 which corresponds to a high sample rate offset of approximately 1%, the average of the phase error indications over the 512 samples shown in FIG. 6 will be approximately zero, which cannot be used to give a good indication of the sample phase offset.

Furthermore, the phase errors will vary significantly between the time at which the average phase error indication is calculated and the time at which the receiver timing is corrected based on the calculated average phase error, which means that the calculated average phase error is no longer indicative of the current sample phase offset when the corresponding phase correction is applied. For the mid-level sample rate offset shown by the line 604, the average of the phase error indications over the 512 samples shown in FIG. 6 can be used to give some indication of the sample phase offset (but not as good an indication as that for the line 606); and due to the delay in calculating the average phase error indication and adjusting the sample phase timing, this mid-level sample rate offset would typically be too large to successfully lock onto the sample timing in a fine phase adjustment stage. It is noted that the maximum sample rate offset that the system can tolerate depends on the dynamics of the correction system connected to the phase error detector. For the fine phase adjustment phase to operate successfully, at the very least, the average of the phase error indications over the averaging period should be representative of the phase error indication at the end of the averaging period, when the correction can be applied.

Therefore, for large sample rate offsets (e.g. sample rate offsets above approximately 0.01%) a coarse adjustment of the frequency of the receiver timing is useful before the fine phase adjustment is performed. In the examples described herein the coarse adjustment can be performed using the phase error indications determined by the error module 204 using the same phase error algorithm as is used to perform the fine phase adjustment. By using the same phase error algorithm for both coarse and fine phase adjustment the problem of handing over between two algorithms is avoided and the size and complexity of the system can be reduced. It is noted that the coarse timing adjustment adjusts the receiver sampling rate, whereas the fine timing adjustment adjusts the receiver sampling phase. That is, the coarse timing adjustment gets the receiver sampling frequency approximately correct, so although the receiver timing after the coarse stage might not be at the ideal sampling times, the error in the sample times doesn't vary significantly between samples. The fine timing adjustment then moves that set of correctly spaced sampling times to sit at the correct sampling points.

The first set of phase error indications determined by the error module 204 forms an error vector of the different phase errors for the sample points. The error vector is passed to the Fourier transform module 206. Referring back to FIG. 3, in step S306 the Fourier transform module 206 applies a Fourier transform to the error vector. In particular, the FFT unit 212 performs a Fast Fourier Transform (FFT) on the error vector. Methods for performing an FFT are known to a person skilled in the art and, as such, are not described in detail herein. The output of the FFT unit 212 is a vector representation of the error vector in the frequency domain.

Figure 7:
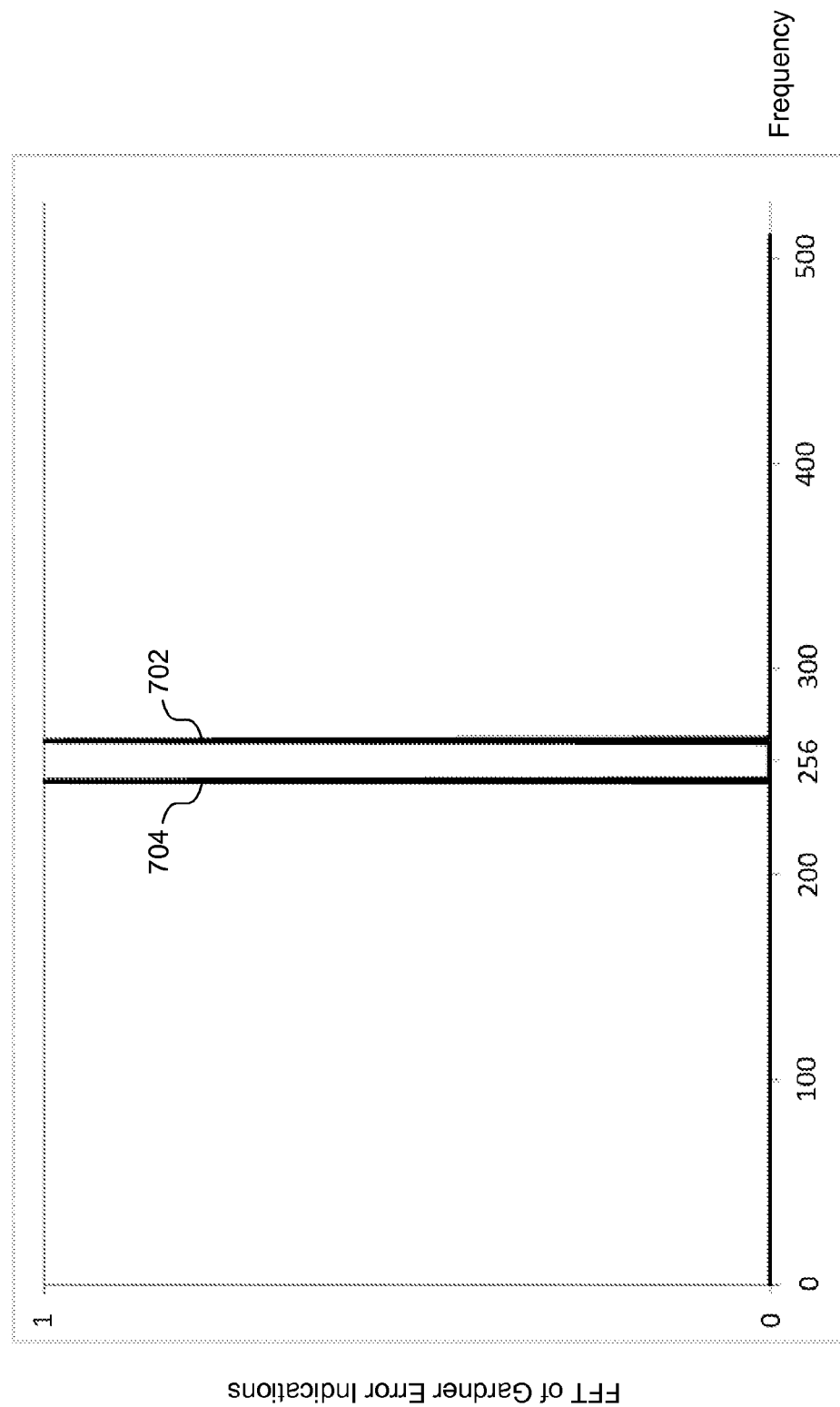
FIG. 7 is a graph showing the Fourier transform of an error vector of phase error indications in a first example.

The frequency vector that is output from the FFT unit 212 will have the same number (e.g. 512) of components (referred to as "frequency bins") as the error vector that is input to the FFT unit 212. In the example shown in FIG. 7, frequency bin 256 represents a non-oscillating component of the phase error vector. Frequency bins (257 to 511) represent respective positive frequency components of the phase error vector and frequency bins 0 to 255 represent respective negative frequency components of the phase error vector. FIG. 7 is a simplistic example of a graph showing the Fourier transform of an error vector which has a sample rate offset of approximately 2%, i.e. a high sample rate offset for which coarse adjustment of the frequency of the receiver timing is to be performed before the fine timing adjustment is performed. FIG. 7 shows that there is a strong frequency component 702 in frequency bin 266 of the 512 frequency bins (numbered 0 to 511) which indicates that the receiver symbol rate is approximately 2% lower than the signal symbol rate (i.e. rrsr=(1+fracOffset)≈0.98), where rrsr is the ratio of the receiver symbol rate to the signal symbol rate and $$fracOffset = \left(\frac{256 - 266}{512}\right)$$

is the offset of the receiver symbol rate (DC from its own viewpoint) relative to the signal peak as a fraction of the total number of FFT bins. The receiver is therefore undersampling the signal and the sample rate should therefore be increased by a correction factor of srcf=1/rssr=1.02 to match the receiver symbol rate to the signal symbol rate. If the receiver 102 is undersampling the signal then the signal peak will be at a positive offset relative to the DC bin, whereas if the receiver 102 is oversampling the signal then the signal peak will be at a negative offset relative to the DC bin.

In the simple example shown in FIG. 7, the phase error indications are determined according to equation 1, so they only show the real component of the phase error indications. Therefore, there is also a strong frequency component 704 in frequency bin 246 which indicates a corresponding positive fractional offset of 2% ( $$\left(\text{i.e. } fracOffset = \frac{256 - 246}{512} \approx 2\%\right).$$

To overcome this ambiguity, complex phase error indications can be determined, e.g. according to equation 4. By considering both the real and imaginary components of the phase error indications, the ambiguity between positive and negative frequency components can be resolved. That is, the oscillation of the real component of the phase error indications can be determined to be representative of either a positive or a negative rotation in the complex plane.

Figure 8:
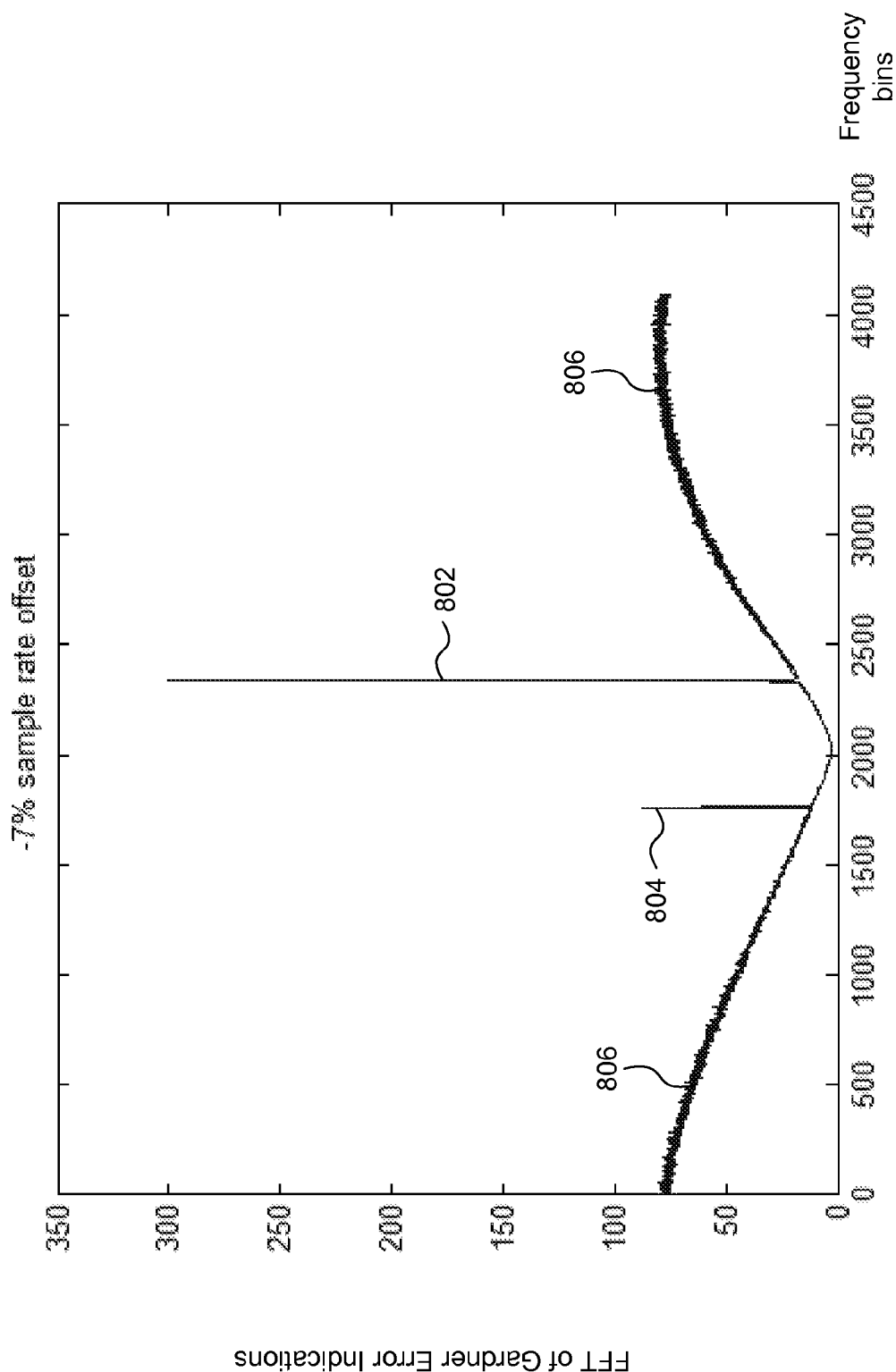
FIG. 8 is a graph showing the Fourier transform of an error vector of phase error indications in a second example.

FIG. 8 shows an example in which there is a −7% sample rate offset (receiver symbol rate is 93% of signal symbol rate), when implementing the complex phase error algorithm ($e_{n,IQ}$) of equation 4. In FIG. 8 the central frequency bin (bin 2049 of 4096 bins) represents a non-oscillating component, whilst frequency bins 2050 to 4096 represent positive frequency components (i.e. when the receiver is undersampling) and frequency bins 0 to 2048 represent negative frequency components (i.e. when the receiver is oversampling). In FIG. 8 there is a strong peak 802 in frequency bin 2336 which represents undersampling an input signal by 7% ( $$(fracOffset = \left(\frac{2049 - 2336}{4096}\right) = -0.07,$$

giving a sample rate correction factor, $$srcf = \frac{1}{(1 + fracOffset)} = \frac{1}{0.93} \approx 1.08).$$

The presence of the secondary peak 804 is explained in more detail below. It is also noted that the frequency domain response of the Gardner algorithm determined according to equation 4 (i.e. $e_{n,IQ}$ shows strong side lobes 806 which appear as a result of using equation 4 to determine the phase error indications.

Figure 9:
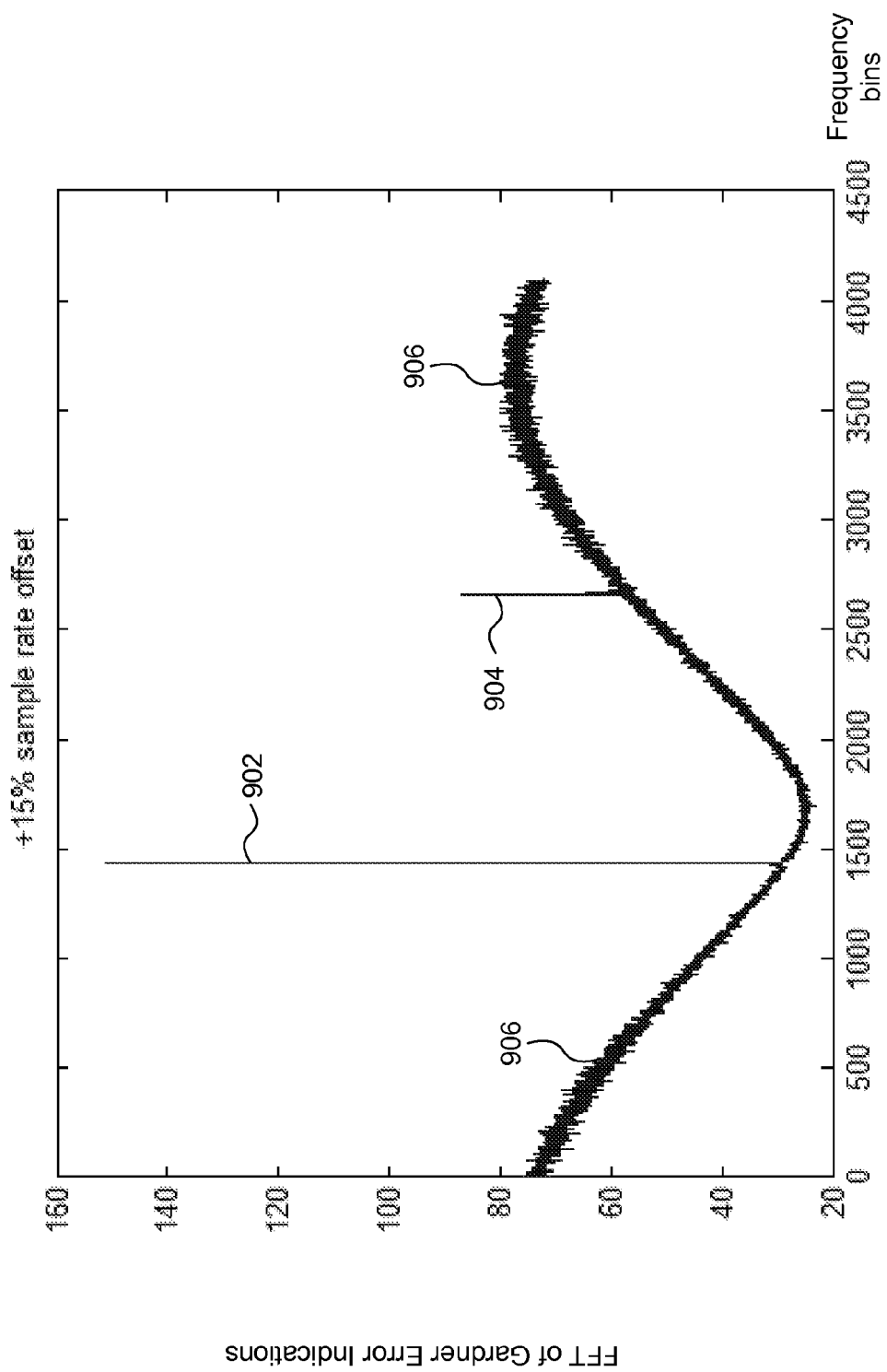
FIG. 9 is a graph showing the Fourier transform of an error vector of phase error indications in a third example.

FIG. 9 shows another example in which there is a +15% sample rate offset (receiver symbol rate is 115% of the signal symbol rate), when implementing the complex phase error algorithm ($e_{n,IQ}$) of equation 4. As in FIG. 8, in FIG. 9 the central frequency bin (bin 2049 of 4096 bins) represents a non-oscillating component, whilst frequency bins 2050 to 4096 represent positive frequency components and frequency bins 0 to 2048 represent negative frequency components. In FIG. 9 there is a strong peak 902 in frequency bin 1435 which represents oversampling an input signal by 15%

$$(fracOffset = \left(\frac{2049 - 1435}{4096}\right) = 0.15,$$

giving a sample rate correction factor, srcf=1/(1+fracOffset)≈ 0.87). The presence of the secondary peak 904 is explained in more detail below. The side lobes 906 can also be seen in FIG. 9.

The frequency vector (e.g. as shown by the graph in FIG. 7) is output from the FFT unit 212 and received by the analysis unit 214. In step S308 the analysis unit 214 analyses the Fourier transform of the error vector to determine a frequency component of the error vector which identifies a frequency difference between the receiver timing and the signal timing. The position of a strong peak in the FFT window reveals the symbol rate offset. Therefore, in relation to the simple example shown in FIG. 7, in step S308 the analysis unit 214 identifies that there is a strong frequency component in bin 266 of the 512 frequency bins, indicating a symbol rate offset of −2% (receiver symbol rate is 98% of signal symbol rate). In relation to the example shown in FIG. 8, the peak 802 indicates a symbol rate offset of −7% because $$\frac{2049 - 2336}{4096} = -7\%.$$

In relation to the example shown in FIG. 9, the peak 902 indicates a symbol rate offset of 15% because $$\frac{2049 - 1435}{4096} = 15\%.$$

The analysis in step S308 may comprise identifying the frequency of the strongest peak in the Fourier transform of the error vector.

The graphs shown in FIGS. 4 to 7 show an ideal (but not realistic) situation in which there is no noise or channel distortion affecting the data signal 100 that is received at the receiver 102. The data signals shown in FIGS. 4 and 5 have perfect sinusoidal waveforms. The data signal is normalised so that the maximum signal value is +1 and the minimum signal value is −1 as shown in FIGS. 4 and 5. This follows through to the values of the phase error indications, such that when there is no noise or channel distortion, and when the Gardner algorithm is used, the phase error indications are as shown in the examples given in FIG. 6, whereby the phase error indications have perfect sinusoidal waveforms with a normalised amplitude such that the maximum level of the phase error indications is +1 and the minimum level of the phase error indications is −1. The Fourier transforms of such phase error indications will have strong narrow peaks with a peak value of +1 and a zero value for other frequency components, as shown in FIG. 7.

However, in the presence of noise or channel distortion (e.g. caused by multipath interference) the data signals will not have perfect sinusoidal waveforms. It follows that the phase error indications will also not have perfect sinusoidal waveforms in the presence of noise or channel distortion. Therefore the peaks in the Fourier transform of the phase error indications will not be as strong since the channel distortion introduces other non-zero frequency components into the phase error indications. FIGS. 8 and 9 show examples of the Fourier transform of the phase error indications in the presence of noise and channel distortion caused by a reflection in the transmission channel of the data signal. As shown in FIG. 8 there is a strong peak 802 in frequency bin 2336 of the 4096 frequency bins. There is also a weaker corresponding peak 804 in frequency bin 1762. The analysis module will use the strongest peak to identify that there is a negative symbol rate offset of 7% in the example shown in FIG. 8.

It is noted that the secondary peaks 804 and 904 appear because in these examples linear interpolation was used to generate the $e_{n+1/4}$ quadrature components. Interpolation is very simple to implement and, though it only provides a rough estimate of the quadrature component and thus does not remove the $2^{nd}$ peak entirely, it generally provides good enough results to distinguish between undersampling and oversampling (i.e. to determine which of the two corresponding peaks in the FFT represents the true sample rate offset). In other examples, the weaker peak (804 or 904) could be greatly reduced if a more accurate interpolation method were used and it would be removed completely if the input signal were sampled at 4 samples per symbol, but this requires a higher sampling rate which may be undesirable.

The side lobes of the FFT output reduce the range over which a peak search can reliably be performed. As the magnitude of the sample rate offset increases, the signal peak moves into the side lobes. Any noise in the signal will be added to the side lobes, while any frequency selectivity in the channel introduced through multipath will reduce the amplitude of the signal peak. The combination of these sets an upper limit to the search range over which you could expect to reliably find the signal peak. So while the FFT output shows sample rate offsets in the range +/−50%, the range over which the sample rate offset can be determined is limited by the side-lobes of the Gardner response.

The sidelobes can be removed by normalising the input samples before applying the Gardner algorithms given above. So $y_n$ becomes $$\frac{y_n}{\text{abs}(y_n)},$$

such that $y_{n,re}$ and $y_{n,im}$ become $$\frac{y_{n,re}}{y_{abs}} \text{ and } \frac{y_{n,im}}{y_{abs}},$$

where:

$$y_{abs} = \sqrt{(y_{n,re})^2 + (y_{n,im})^2} \quad (5)$$

This flattens the Gardner response in the frequency domain, allowing the full +/−50% sample rate offset FFT output range to be searched.

The strength of the strongest peak (e.g. peak 802) in the Fourier transform of the phase errors gives an indication of the channel conditions (e.g. the channel distortion) that are experienced by the data signal 100 received at the receiver 102. An indication of the channel conditions that are experienced by the data signal 100 is useful in determining how the fine phase adjustment should be performed. Therefore, as well as identifying the frequency of the strongest peak in the Fourier transform of the error vector, the analysis performed by the analysis unit 214 in step S308 may also comprise determining the strength of the strongest peak in the Fourier transform of the error vector to thereby determine an indication of the channel conditions experienced by the data signal.

The information about the channel conditions provides information about the expected output level (and the corrective gain to be applied) during the fine timing stage. However, for a clean signal in a flat channel, the expected magnitude of the signal peak varies with sample rate offset. The signal peak in the FFT output is due to the symbol transitions occurring over the sampling window. The strongest frequency component of these transitions is expected to be at the signal symbol rate. If the receiver is sampling at the signal symbol rate there will be N/2 signal symbol periods over an N-sample measurement window. If the receiver is sampling more quickly than this (oversampling) then, while the receiver has taken N samples, assuming N/2 signal symbol periods over this window, there have actually been fewer than N/2 signal symbol periods (and therefore fewer signal symbol transitions) in that time. Similarly if the receiver samples too slowly (undersampling), there will have been more than N/2 signal symbol periods over the N-sample measurement window. The result of this is that the number of signal transitions perceived over the measurement window depends on the sample rate offset. The magnitude of the FFT peak is proportional to the number of signal transitions over the measurement window, so for a signal peak at an offset of m frequency bins relative to the DC bin of an N-point FFT, the expected signal peak magnitude, Emag(m), is given by:

$$E\text{mag}(m) = \text{mag}(0)*(1+m/N) \quad (6)$$

where mag(0) is the magnitude of the signal peak at zero sample rate offset for a clean, flat channel (i.e. in a non-frequency-selective channel without noise). For a measured signal peak magnitude mag(m) at offset m, the channel gain normalisation factor (cgn) to be applied in the fine timing stage is therefore given by:

$$\text{cgn} = E\text{mag}(m)/\text{mag}(m) = (\text{mag}(0)/\text{mag}(m))*(1+m/N) \quad (7)$$

The results of the analysis of the Fourier transform of the error vector are fed back to the receive module 202 and to the error module 204.

In step S310 the receive module 202 adjusts the frequency of the receiver symbol timing based on the identified frequency of the strongest peak in the Fourier transform of the error vector which indicates the frequency difference between the receiver symbol timing and the signal symbol timing. This is achieved by controlling the receiver sample rate within the timing module 210. The frequency difference indicated by the Fourier transform module 206 indicates the frequency difference between the receiver symbol timing and the signal symbol timing with an accuracy related to the granularity of the frequency bins.

As described above, in some examples, the coarse timing adjustment stage uses the phase error indications $e_{n,IQ}$ (determined according to equation 4) to build a vector of length N, takes an N-point FFT and finds the peak magnitude of the complex FFT result. The offset, m, of the DC bin relative to the peak gives a measure of the sample rate offset. The sample rate is then adjusted to be equal to Current_sample_rate/(1+(m/N)), where m is given in terms of frequency bins, to give −0.5<m/N<=0.5 as a fractional offset.

With the adjusted receiver symbol timing, the data signal 100 is received by the receive module 202 with a symbol timing that is very close in frequency to the frequency of the signal symbol timing, although the phase of the receiver symbol timing might not be matched to the phase of the signal symbol timing after the coarse adjustment of step S310. Therefore, the frequency of the sampling points is close to the frequency of the ideal sampling points shown in FIG. 4, but they may all need to be shifted to adjust their phase.

Then the fine timing adjustment stage takes the average (e.g. the mean) over a defined averaging period of whichever algorithm is chosen as the basis of the error metric (e.g. $e_{n,re}$, $e_{n,complex}$ or $e_{n,IA}$). This average value is fed into the PLL of the timing module 210, which in turn controls the sample rate of the receive module 202. In step S312 the error module 204 determines a second set of phase error indications for respective samples over a second sampling period according to the same phase error algorithm that was used in step S304 as described above (e.g. the Gardner algorithm). As described above, each of the phase error indications is a measure of the error between the receiver symbol timing and the signal symbol timing for a particular sample. However, since the frequency of the receiver symbol timing is approximately correct due to the coarse timing synchronisation provided by the previous steps (steps S304 to S310), the phase error indications will not oscillate quickly over the second sampling period. With reference to FIG. 6, the phase error indications determined in step S312 may oscillate with frequencies approximately at or below the frequency with which the dashed line 604 oscillates. In particular, the phase errors will not oscillate as quickly as line 602, and will preferably oscillate approximately as quickly as (or slower than) line 606.

Furthermore, in step S312 the phase error indications are output to the averaging module 208 which determines the average of the second set of phase errors over the second sampling period. As described above, the phase error indications may be determined according to any of equations 1 to 3. The averaging module 208 may calculate a running average as the phase error indications are determined. In this way, a vector of the phase error indications is not used, which is in contrast to the use of the error vector by the Fourier transform module 206 as described above. As described above, for the average of the phase error indications to be useful for fine-tuning the phase of the receiver symbol timing, the phase error indications should not vary by too much over the second sampling period, otherwise the PLL might not be able to lock onto the correct signal timing. Therefore, the first sampling period used to determine the Fourier transform in step S306 may be longer than the second sampling period over which the phase errors are averaged in step S312. For example, the first sampling period may be ~8192 samples as described above, and the second sampling period may be ~2000 samples or less. That is, the averaging module 208 may average the phase errors over ~2000 samples in step S312.

The average of the second set of phase error indications is output from the averaging module 208 and provided to the receive module 202. In step S314 the receive module 202 adjusts the phase of the receiver symbol timing based on the determined average of the second set of phase error indications. This is achieved by feeding the average phase error indication to the PLL of the timing module 210 which acts to adjust the receiver timing accordingly with the aim of reducing the phase error of the receiver timing. For example where the phase error algorithm is the Gardner algorithm, a positive average phase error indication indicates that the receive module 202 is sampling the data signal later than the ideal sampling points shown in FIG. 4. In contrast, a negative average phase error indication indicates that the receive module 202 is sampling the data signal earlier than the ideal sampling points shown in FIG. 4. Therefore, by adjusting the timing with which the data signal is sampled based on the averaged phase error indications, the receiver symbol timing can be adjusted to more closely match the signal symbol timing.

The coarse adjustment is performed over a long enough sampling period (referred to herein as the "first sampling period") so that the frequency of the receiver timing is close enough to the frequency of the signal timing for the fine phase adjustment to lock onto the signal timing. The coarse timing adjustment (steps S304 to S310) is performed once to get the receiver frequency approximately correct, then the fine phase adjustment (steps S312 and S314) can be performed more than once (e.g. continuously) to ensure that the receiver timing stays correctly aligned with the signal timing.

The averaging of the phase error indications is performed to overcome problems caused by channel conditions such as noise and/or channel distortion experienced by the data signal. The more noise that the data signal is expected to experience, the longer the sampling period may be which is used by the averaging module 208 to average the phase error indications to thereby overcome the effects of the noise, although it is noted that this sampling period might not be adjustable in real-time. As described above, the analysis unit 214 provides an indication of the channel conditions experienced by the data signal (determined based on the peak of the Fourier transform of the phase error indications) to the error module 204. The second sampling period can be controlled to be smaller than the first sampling period, as described above. For example, when the first sampling period used for the coarse timing adjustment is 8192 samples then the frequency adjustment in step S310 has an accuracy of approximately 0.02% as described above. With a longer first sampling period (e.g. 16384 samples) the frequency adjustment in step S310 would have a higher accuracy (e.g. an accuracy of approximately 0.01%) such that the phase error indications that are averaged in step S312 would not oscillate as quickly, and hence a longer second sampling period may be used for the fine phase adjustment.

Furthermore, if the channel conditions are such that, for example, the amplitude of the phase error indications is reduced by 50% relative to that expected when there is no channel distortion, then this will be seen by a 50% drop in the peak in the FFT of the phase error indications. This information is fed back to the error module 204, so that for the fine phase adjustment, it is known that, due to the channel conditions, the levels of the phase error indications will be 50% lower than expected. This can be taken into account when determining the average phase error indication over the second sampling period. For example, gains may be applied to the phase error indications to adjust the phase error indications to take account of the channel conditions before the phase error indications are averaged (or after the phase error indications are averaged). For example, the phase error indications could be doubled before they are averaged to take account of the indication that the levels of the phase error indications have reduced by 50% due to the channel conditions. Therefore, in general, the channel conditions determined by the Fourier transform module 206 can be taken into account during the fine phase adjustment (e.g. to adjust the gains applied to the phase error indications either before or within the PLL of the timing module 210) in order to correctly adjust the timing of the receiver symbol timing in the fine phase adjustment phase. Since the coarse error adjustment stage uses the same phase error algorithm as the fine error adjustment, the results of the coarse error adjustment (e.g. the peak level of the Fourier transform of the first set of phase error indications) can be used to infer information about the channel conditions and to adjust the gains applied to the phase error indications determined by the phase error algorithm during the fine phase adjustment in accordance with the determined channel conditions. Therefore the accuracy of the fine phase adjustment is improved based on the results of the coarse error adjustment (e.g. based on the peak level of the Fourier transform of the first set of phase error indications) which provide an indication of the channel conditions experienced by the data signal. In this way, the operation of the PLL is adjusted to suit the particular channel conditions that the data signal 100 is experiencing. This helps to keep the fine timing loop dynamics and capture range consistent across different channel conditions and allowing the receive module 202 to more reliably adjust the receiver symbol timing to match the signal symbol timing.

Therefore, in summary, after using the phase error algorithm in combination with the Fourier transform module 206 to achieve coarse symbol timing adjustment (e.g. adjustment of the frequency of the receiver symbol timing), the Fourier transform stage can be removed or bypassed, allowing the average of the phase error indications to be used for fine symbol timing adjustment (e.g. adjustment of the phase of the receiver symbol timing). The same phase error algorithm can therefore be used for both the coarse and fine stages of the receiver timing adjustment, thereby saving code size and implementation time.

Once the coarse and fine phase adjustment phases have been carried out, the receiver symbol timing closely matches the signal symbol timing and the output from the receive module 202 (denoted "Data Out" in FIG. 2) can be reliably used as a representation of the data symbols present in the data signal. As mentioned above, the coarse timing adjustment can be applied once (e.g. on startup) to get the frequency of the receiver timing approximately correct, and then the fine timing adjustment can be applied repeatedly to ensure that the receiver timing (frequency and phase) is locked onto the signal timing.

The examples described in detail above relate to adjusting the receiver symbol timing to more closely match the signal symbol timing. As described above, corresponding principles can be used to adjust the receiver carrier timing to more closely match the signal carrier timing. That is, the methods described above for adjusting the receiver symbol timing can be suitably adapted to be applied for adjusting the receiver carrier timing. A training sequence may be used for the receiver 102 to lock onto the carrier timing. A training sequence is a standard sequence of data symbols that are known in advance by both the transmitter and the receiver 102 and is transmitted before the transmission of real data so that the receiver 102 can lock onto the carrier timing before the real data is transmitted.

A frequency offset between the receiver carrier timing and the signal carrier timing results in a received signal which rotates in the complex plane. In accordance with the examples described herein, a first set of phase error indications for different samples are determined over a first sampling period using a suitable phase error algorithm. The first set of phase error indications forms an error vector. A Fourier transform is performed on the error vector, which is then analysed to determine a frequency difference between the receiver carrier frequency and the signal carrier frequency. Coarse timing adjustment is achieved by adjusting the frequency of the receiver carrier timing in accordance with the determined frequency difference. After the coarse timing adjustment has been implemented, a second set of subsequent phase error indications is determined using the same phase error algorithm, and these phase error indications are averaged over a second sampling period (which may be shorter than the first sampling period). Fine timing adjustment is achieved by adjusting the phase of the receiver carrier timing using the PLL in the timing module 210 based on the average of the second set of phase error indications.

When the methods are used for adjusting the receiver carrier timing, a phase error algorithm which is different to the Gardner algorithm may be used. The phase error algorithm which is used for receiver carrier adjustment may determine phase error indications by determining an angle relative to the real axis in the complex plane. For example, the M-Power method is a known method for aligning samples with the real axis, such that deviations from the real-axis represent errors in the receiver timing. For example, with a quadrature amplitude modulation (QAM) signal, M=4 such that the value of each sample is raised to the $4^{th}$ power, such that in the complex plane samples at angles of $$\frac{\pi}{4}, \frac{3\pi}{4}, \frac{5\pi}{4} \text{ and } \frac{7\pi}{4}$$

to the positive real axis (as error-free QAM samples should be in the complex plane) when raised to the $4^{th}$ power should all lie along the real axis (in the negative direction). The differences in the complex angle between the $4^{th}$ powers of the samples and the negative real axis are indications of phase errors in the receiver carrier timing. If there is a frequency offset between the receiver carrier timing and the signal carrier timing then the determined phase error indications will be periodic (e.g. sinusoidal). Therefore, the carrier phase error indications can be used as described above in relation to the symbol phase error indications determined by the Gardner algorithm, to first perform coarse carrier timing adjustment based on the Fourier transform of a first set of the phase error indications and then to perform fine carrier timing adjustment based on the average of a second set of the phase error indications.

Generally, any of the functions, methods, techniques or components described above can be implemented in modules using software, firmware, hardware (e.g., fixed logic circuitry), or any combination of these implementations. The terms "module," "functionality," "component", "block", "unit" and/or "logic" are used herein to generally represent software, firmware, hardware, or any combination thereof.

In the case of a software implementation, the module, functionality, component, block, unit or logic represents program code that performs specified tasks when executed on a processor (e.g. one or more CPUs). In one example, the methods described may be performed by a processor (e.g. processor 104) configured with software in machine readable form stored as a computer program product on a computer-readable medium. One such configuration of a computer-readable medium is signal bearing medium and thus is configured to transmit the instructions (e.g. as a carrier wave) to the computing device, such as via a network. The computer-readable medium may also be configured as a computer-readable storage medium (e.g. memory 106) and thus is not a signal bearing medium. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The software may be in the form of a computer program comprising computer program code for configuring a computer to perform the constituent portions of described methods or in the form of a computer program comprising computer program code means adapted to perform all the steps of any of the methods described herein when the program is run on a computer and where the computer program may be embodied on a computer readable medium. The program code can be stored in one or more computer readable media. The features of the techniques described herein are platform-independent, meaning that the techniques may be implemented on a variety of computing platforms having a variety of processors.

Those skilled in the art will also realize that all, or a portion of the functionality, techniques or methods may be carried out by a dedicated circuit, an application-specific integrated circuit, a programmable logic array, a field-programmable gate array, or the like. For example, the module, functionality, component or logic may comprise hardware in the form of circuitry. Such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnects, by way of example. Such elements may be provided as custom circuits or standard cell libraries, macros, or at other levels of abstraction. Such elements may be interconnected in a specific arrangement. The module, functionality, component or logic may include circuitry that is fixed function and circuitry that can be programmed to perform a function or functions; such programming may be provided from a firmware or software update or control mechanism. In an example, hardware logic has circuitry that implements a fixed function operation, state machine or process.

It is also intended to encompass software which "describes" or defines the configuration of hardware that implements a module, functionality, component or logic described above, such as HDL (hardware description language) software, as is used for designing integrated circuits, or for configuring programmable chips, to carry out desired functions. That is, there may be provided a computer readable storage medium having encoded thereon computer readable program code for generating a processing unit configured to perform any of the methods described herein, or for generating a processing unit comprising any apparatus described herein.

The term 'processor' and 'computer' are used herein to refer to any device, or portion thereof, with processing capability such that it can execute instructions, or a dedicated circuit capable of carrying out all or a portion of the functionality or methods, or any combination thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It will be understood that the benefits and advantages described above may relate to one example or may relate to several examples.

Any range or value given herein may be extended or altered without losing the effect sought, as will be apparent to the skilled person. The steps of the methods described herein may be carried out in any suitable order, or simultaneously where appropriate. Aspects of any of the examples described above may be combined with aspects of any of the other examples described to form further examples without losing the effect sought.

The invention claimed is:

1. A method of adjusting a receiver timing towards a signal timing of a data signal received at a receiver, said signal timing being a characteristic of said data signal, the method comprising:
   receiving the data signal using a receive mode operating in accordance with the receiver timing;
   determining, according to particular phase error algorithm, a first set of phase error indications indicating phase errors between the receiver timing and the signal timing of the received data signal, wherein the first set of phase error indications forms an error vector;
   applying a Fourier transform to the error vector;
   analysing the Fourier transform of the error vector to determine a frequency component of the error vector which identifies a frequency difference between the receiver timing and the signal timing;
   adjusting the receiver timing to a first adjusted receiver timing based on the identified frequency difference;
   determining an average of a second set of phase error indications indicating phase errors between the first adjusted receiver timing and the signal timing according to said particular phase error algorithm; and
   adjusting the first adjusted receiver timing to a second adjusted receiver timing based on the determined average of the second set of phase error indications.

2. The method of claim 1 wherein the receiver timing is adjusted to the first adjusted receiver timing by adjusting the frequency of the receiver timing based on the identified frequency difference, and
   wherein said first adjusted receiver timing is adjusted to the second adjusted receiver timing by adjusting the phase of the first adjusted receiver timing based on the determined average of the second set of phase error indications.

3. The method of claim 1 wherein the first set of phase error indications are determined over a first sampling period, and
   wherein the average of the second set of phase error indications is determined over a second sampling period.

4. The method of claim 3 wherein the first sampling period is longer than the second sampling period.

5. The method of claim 1 wherein the signal timing is a symbol timing of data symbols in the data signal, and wherein the receiver timing is the timing with which the data signal is sampled to determine the data symbols in said step of receiving the data signal.

6. The method of claim 5 wherein the particular phase error algorithm comprises the Gardner algorithm.

7. The method of claim 6 wherein only real components of the data signal are used in the Gardner algorithm in one or both of the steps of: (i) determining the first set of phase error indications, and (ii) determining the average of a second set of phase error indications.

8. The method of claim 6 wherein complex values representing the data signal are used in the Gardner algorithm, wherein in one or both of the steps of: (i) determining the first set of phase error indications, and (ii) determining the average of a second set of phase error indications, the phase error indications are determined by summing measures of phase errors of real components of the complex values with measures of phase errors of imaginary components of the complex values.

9. The method of claim 6 wherein in one or both of the steps of: (i) determining the first set of phase error indications, and (ii) determining the average of a second set of phase error indications, the phase error indications are determined by performing a coherent sum of in-phase and antiphase measures of phase error.

10. The method of claim 6 wherein the step of determining the first set of phase error indications comprises combining an in-phase component with a quadrature component relative to the in-phase component.

11. The method of claim 6 further comprising determining the strength of the strongest peak of the Fourier transform of the error vector to thereby determine an indication of channel conditions experienced by the data signal.

12. The method of claim 11 further comprising normalising samples of the data signal, wherein the normalised samples are used to determine the first set of phase error indications.

13. The method of claim 11 further comprising applying gains to the second set of phase error indications, wherein the gains are adjusted based on the determined indication of channel conditions.

14. The method of claim 1 wherein the receiver timing is controlled using a Phase Locked Loop.

15. The method of claim 1 wherein the signal timing is a carrier timing of the data signal, and wherein the receiver timing is an estimate of the carrier timing which is used in said step of receiving the data signal.

16. The method of claim 1 wherein said frequency component of the error vector is determined by identifying the frequency of the strongest peak in the Fourier transform of the error vector.

17. A receiver configured to adjust a receiver timing towards a signal timing of a data signal received at a receiver, said signal timing being a characteristic of said data signal, the receiver comprising:
- a receive module configured to receive the data signal in accordance with a receiver timing;
- an error module configured to determine, according to a particular phase error algorithm a first set of phase error indications indicating phase errors between the receiver timing and the signal timing of the received data signal, wherein the first set of 30 phase error indications forms an error vector; and
- a Fourier transform module configured to apply a Fourier transform to the error vector, the Fourier transform module being further configured to analyse the Fourier transform of the error vector to determine a frequency component of the error vector which identifies a frequency difference between the receiver timing and the signal timing;
- wherein the receive module is configured to adjust the receiver timing to a first adjusted receiver timing based on the identified frequency difference;
- wherein the error module is configured to determine an average of a second set of phase error indications indicating phase errors between the first adjusted receiver timing and the signal timing according to said particular phase error algorithm; and
- wherein the receive module is configured to adjust the first adjusted receiver timing to a second adjusted receiver timing based on the determined average of the second set of phase error indications.

18. The receiver of claim 17 wherein the signal timing is a symbol timing of data symbols in the data signal, and wherein the receiver timing is the timing with which the receive module is configured to sample the data signal to determine the data symbols, and wherein the particular phase error algorithm comprises the Gardner algorithm.

19. The receiver of claim 17 wherein the signal timing is a carrier timing of the data signal, and wherein the receiver timing is an estimate of the carrier timing which the receive module is configured to use to receive the data signal.

20. The receiver of claim 17 wherein the Fourier transform module comprises an analysis unit configured to identify the frequency of the strongest peak in the Fourier transform of the error vector to thereby determine said frequency component of the error vector.

21. A non-transitory computer readable storage medium having stored thereon processor executable instructions that when executed cause at least one processor to:
- receive a data signal at a receiver in accordance with a receiver timing, said data signal having a characteristic signal timing;
- determine, according to a particular phase error algorithm, a first set of phase error indications indicating phase errors between the receiver timing and the signal timing, wherein the first set of phase error indications forms an error vector;
- apply a Fourier transform to the error vector;
- analyse the Fourier transform of the error vector to determine a frequency component of the error vector which identifies a frequency difference between the receiver timing and the signal timing;
- adjust the receiver timing to a first adjusted receiver timing based on the identified frequency difference;
- determine an average of a second set of phase error indications indicating phase errors between the first adjusted receiver timing and the signal timing according to said particular phase error algorithm; and
- adjust the first adjusted receiver timing to a second adjusted receiver timing based on the determined average of the second set of phase error indications.

\* \* \* \* \*